United States Patent
Ishitobi et al.

(10) Patent No.: US 9,679,646 B2
(45) Date of Patent: Jun. 13, 2017

(54) NONVOLATILE SEMICONDUCTOR STORAGE DEVICE AND REWRITING METHOD THEREOF

(71) Applicant: Panasonic Intellectual Property Management Co., Ltd., Osaka (JP)

(72) Inventors: Yuriko Ishitobi, Osaka (JP); Hitoshi Suwa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/979,739

(22) Filed: Dec. 28, 2015

(65) Prior Publication Data

US 2016/0111155 A1    Apr. 21, 2016

Related U.S. Application Data

(63) Continuation of application No. PCT/JP2014/003422, filed on Jun. 26, 2014.

(30) Foreign Application Priority Data

Jul. 17, 2013    (JP) .................... 2013-148695

(51) Int. Cl.
    *G11C 13/00*    (2006.01)
    *G11C 11/16*    (2006.01)
(52) U.S. Cl.
    CPC .......... *G11C 13/0069* (2013.01); *G11C 11/16* (2013.01); *G11C 11/1675* (2013.01);
    (Continued)
(58) Field of Classification Search
    CPC ............................................. G11C 2013/0076
    See application file for complete search history.

(56) References Cited

U.S. PATENT DOCUMENTS 7,522,449 B2 *  4/2009  Ro ............... G11C 11/5678
                                                  365/148
7,542,356 B2 *  6/2009  Lee ................... G11C 7/06
                                                  365/185.14
(Continued)

FOREIGN PATENT DOCUMENTS

JP         7-057489         3/1995
JP         8-221994         8/1996
(Continued)

OTHER PUBLICATIONS

International Search Report of PCT application No. PCT/JP2014/003422 dated Sep. 2, 2014.

*Primary Examiner* — R Lance Reidlinger
(74) *Attorney, Agent, or Firm* — McDermott Will & Emery LLP

(57) ABSTRACT

A bitwise bidirectionally rewritable nonvolatile semiconductor storage device capable of performing a high-speed data rewrite, while enhancing endurance characteristics and data-retention characteristics of a memory cell. To achieve high-speed generation of rewrite-bit information indicating that a data rewrite is needed or not, the structure employs a logic circuit corresponding to the number of change patterns of write conditions and concurrently compares between read-out data RO of memory at the start of the data rewrite and prepared write data DIN. After an electrical data rewrite of the memory, the data rewrite is verified based on the rewrite-bit information stored in an internal buffer circuit. This protects an already-rewritten memory cell from unnecessary additional rewrite.

5 Claims, 4 Drawing Sheets

(52) U.S. Cl.
CPC ........ *G11C 11/1677* (2013.01); *G11C 13/004* (2013.01); *G11C 13/0007* (2013.01); *G11C 13/0023* (2013.01); *G11C 13/0035* (2013.01); *G11C 13/0064* (2013.01); *G11C 2013/0073* (2013.01); *G11C 2013/0076* (2013.01)

(56) References Cited

U.S. PATENT DOCUMENTS

| | | | | |
|---|---|---|---|---|
| 8,913,425 | B2 * | 12/2014 | Chu | G11C 13/0004 365/148 |
| 9,208,874 | B2 * | 12/2015 | Lee | G11C 13/0064 |
| 2010/0254184 | A1 | 10/2010 | Tsukada | |
| 2011/0261616 | A1 | 10/2011 | Kim | |
| 2013/0033929 | A1 | 2/2013 | Kim | |
| 2013/0088911 | A1 | 4/2013 | Nakura et al. | |

FOREIGN PATENT DOCUMENTS

| | | |
|---|---|---|
| JP | 2010-244607 | 10/2010 |
| JP | 2013-084324 | 5/2013 |
| JP | 2013-525937 | 6/2013 |

* cited by examiner

FIG. 2

| MODE | DIN1 | RO | DO1 |
|---|---|---|---|
| 0 | 0 | 0 | 1 |
| 0 | 0 | 1 | 1 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

FIG. 3

| MODE | DIN2 | RO | DO2 |
|---|---|---|---|
| 0 | 0 | 0 | 1 |
| 0 | 0 | 1 | 0 |
| 0 | 1 | 0 | 1 |
| 0 | 1 | 1 | 1 |
| 1 | 0 | 0 | 1 |
| 1 | 0 | 1 | 0 |
| 1 | 1 | 0 | 1 |
| 1 | 1 | 1 | 1 |

NONVOLATILE SEMICONDUCTOR STORAGE DEVICE AND REWRITING METHOD THEREOF

TECHNICAL FIELD

The present disclosure relates to technique for enhancement of endurance characteristics and data-retention characteristics of a nonvolatile semiconductor storage device and for increase in rewriting speed of the device.

BACKGROUND ART

In recent years, with the increase in speed of processing by micro computers and the increase in storage capacity of nonvolatile semiconductor storage devices, there has been a strong demand for high-speed rewriting of a nonvolatile semiconductor storage device.

The following is a commonly-used method of rewriting flash memory: reading out the data of memory cells at the start of rewriting for verifying the write condition of the memory cells; and then erasing or rewriting the memory cells. Employing the method decreases the number of erasing flash memory and the number of program executions, enhancing endurance characteristics. Besides, as for a memory cell in which an expected value has already been written at the start of rewriting, no rewriting voltage is applied, which contributes to enhanced data-retention characteristics.

For example, according to Patent Literature 1, prior to rewriting flash memory, as for a flash memory cell with no need for pre-writing and erasing before data writing, they are omitted. This allows the number of rewriting data to delay reaching a limit value, suppressing degradation of reliability and decreasing the average time required for rewriting data.

CITATION LIST

Patent Literature

PTL 1: Japanese Unexamined Patent Application Publication No. H08-221994

SUMMARY OF THE DISCLOSURE

In recent years, development work on nonvolatile semiconductor storage devices, such as ReRAM (resistance random access memory) and MRAM (magnetoresistive random access memory), is increasingly proceeding. They can process bitwise bidirectional rewriting with no need for erasing on a fixed-block basis. As for such a nonvolatile semiconductor storage device, too, the rewriting control should preferably be performed in a way that the write condition of the memory cells is verified for enhancement of endurance characteristics and data-retention characteristics of memory cells.

The purpose of the present disclosure is to provide a bitwise bidirectionally rewritable nonvolatile semiconductor storage device capable of high-speed rewriting, while enhancing endurance characteristics and data-retention characteristics of memory cells.

The nonvolatile semiconductor storage device of the present disclosure has a nonvolatile memory array with a plurality of memory cells having a plurality of write conditions, a decode circuit that selects at least any one of the memory cells of the nonvolatile memory array, and a read-out circuit that obtains read-out data from a selected memory cell. The device further has a rewrite-bit-information generating circuit and a data rewrite circuit. The rewrite-bit-information generating circuit generates, based on a read-out data and a prepared write data, rewrite-bit information indicating that a data rewrite is needed or not. According to the generated rewrite-bit information, the data rewrite circuit rewrites data of a selected memory cell. The rewrite-bit-information generating circuit has a unit formed of an internal buffer circuit, a selection circuit, and a logic circuit, and the unit is structured so as to correspond to the number of change patterns of the write conditions of the memory cells. The internal buffer circuit retains the generated rewrite-bit information. The selection circuit selects and outputs any one of the write data and the rewrite-bit information stored in the internal buffer circuit. Based on the read-out data and the output from the selection circuit, the logic circuit determines the rewrite-bit information. In a read-back mode where the selection circuit selects the write data and outputs it, when a combination of read-out data and write data agrees with the change pattern of a write condition assigned to the logic circuit, the logic circuit determines the rewrite-bit information so as to indicate necessity of a data rewrite. When the combination of read-out data and write data does not agree with the change pattern of a write condition assigned to the logic circuit, the logic circuit determines the rewrite-bit information so as to indicate unnecessity of a data rewrite. On the other hand, in a verify mode where the selection circuit selects the rewrite-bit information stored in the internal buffer circuit and outputs it, when the rewrite-bit information stored in the internal buffer circuit indicates that a data rewrite has been performed just before and when the read-out data read again from the selected memory cell does not agree with a post-change expected-value data of the change pattern of a write condition assigned to the logic circuit, the logic circuit determines the rewrite-bit information so as to indicate necessity of once-again data rewrite. When the rewrite-bit information stored in the internal buffer circuit indicates that no data rewrite has been performed just before and/or when the read-out data read again from the selected memory cell agrees with a post-change expected-value data of the change pattern of a write condition assigned to the logic circuit, the logic circuit determines the rewrite-bit information so as to indicate unnecessity of once-again data rewrite.

The method of rewriting a nonvolatile semiconductor storage device of the present disclosure is relates to the method of rewriting the nonvolatile semiconductor storage device with nonvolatile memory array containing a plurality of memory cells each of which has a plurality of write conditions. The rewriting method has a read-out data acquisition step for obtaining read-out data from at least one memory cell selected from the nonvolatile memory array and a rewrite-bit-information generating step for concurrently generating rewrite-bit information indicating that a data rewrite is needed or not for a change pattern of each write condition of the plurality of memory cells, based on the read-out data and a prepared write data. The method further has a first change-pattern repeat step and a second change-pattern repeat step. In the first change-pattern repeat step, according to the generated rewrite-bit information, a first change-pattern data rewrite is repeated until completion of the first change-pattern data rewrite on a selected memory cell is confirmed. In the second change-pattern repeat step, according to the generated rewrite-bit information, a second change-pattern data rewrite is repeated until completion of the second change-pattern data rewrite on a selected memory cell is confirmed.

According to the present disclosure in data rewriting of a nonvolatile semiconductor storage device, bitwise write control can be determined in one-time verification of read-out data. The method not only enhances endurance characteristics and data retention characteristics of memory cells, but also increases rewriting speed. Besides, employing a verify mode—in which a rewrite verification is performed according to the retained rewrite-bit information and the read-out data from the memory—prevents an already-rewritten memory cell from unnecessary additional rewrite.

BRIEF DESCRIPTION OF DRAWINGS

FIG. 2 shows a truth table of a first logic circuit in FIG. 1.

FIG. 3 shows a truth table of a second logic circuit in FIG. 1.

DESCRIPTION OF EMBODIMENTS

Hereinafter, exemplary embodiments of the present disclosure will be described in detail with reference to accompanying drawings.

First Exemplary Embodiment

Figure 1:
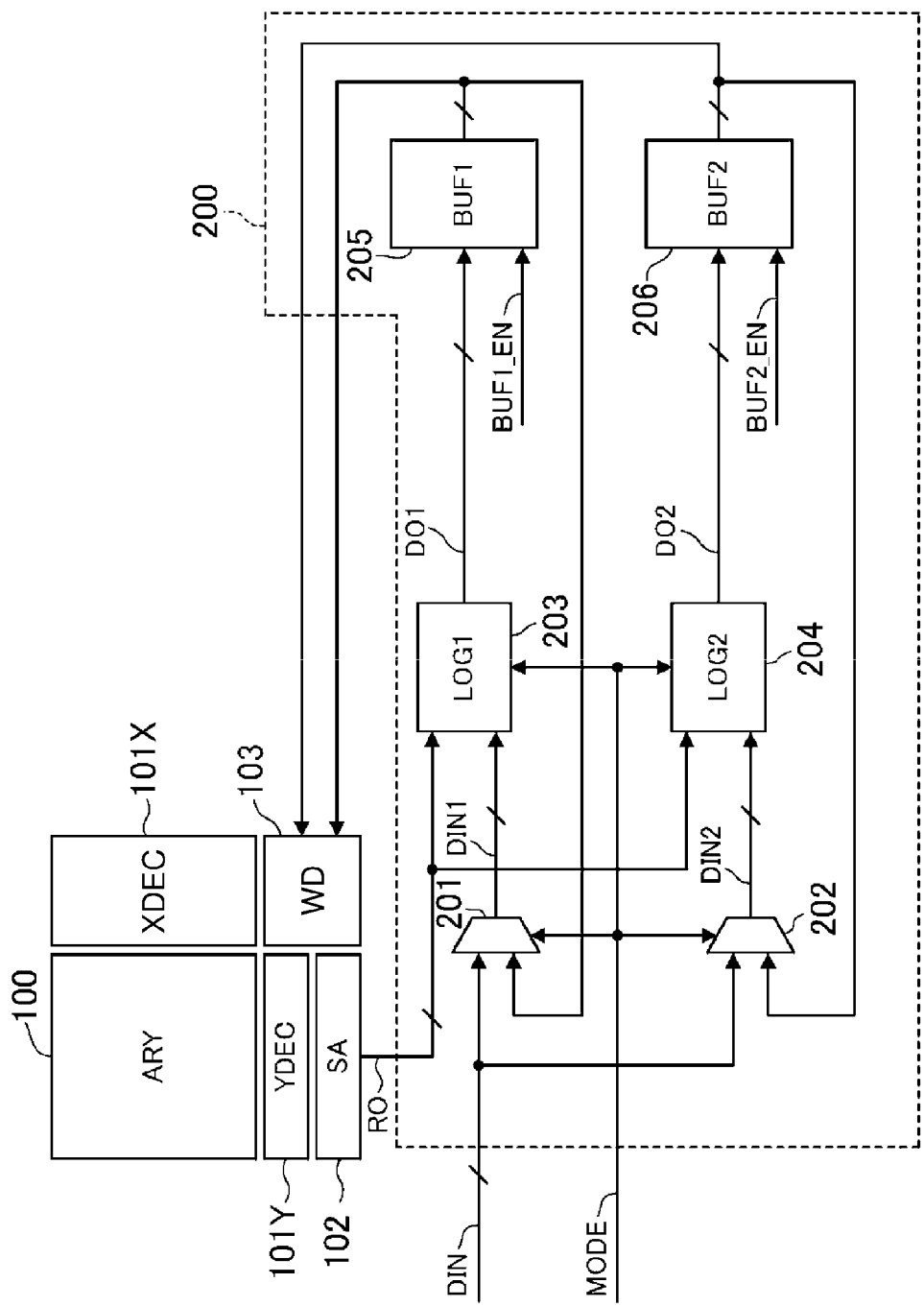
FIG. 1 is a block diagram of a nonvolatile semiconductor storage device of a first exemplary embodiment of the present disclosure.

FIG. 1 shows the structure of a nonvolatile semiconductor storage device of the first exemplary embodiment of the present disclosure. The nonvolatile semiconductor storage device of FIG. 1, which is a bitwise bidirectionally rewritable storage device such as ReRAM and MRRAM, has nonvolatile memory array (ARY) 100 formed of a plurality of memory cells each of which having binary data. Further, the device has row decode circuit (XDEC) 101X and column decode circuit (YDEC) 101Y, which select at least any one memory cell from nonvolatile memory array 100, and sense amplifier (SA) 102 as a read-out circuit for obtaining read-out data from the memory cells. Further, the device has data rewrite circuit (WD) 103 for electrically rewriting the write condition of the memory cells, and rewrite-bit-information generating circuit 200 for generating rewrite-bit information based on prepared write data DIN, read-out data RO from nonvolatile memory array 100, and mode control signal MODE. Each of write data DIN, read-out data RO, and rewrite-bit information has 8-bit-structued one address.

Rewrite-bit-information generating circuit 200 shown in FIG. 1 is structured so as to process the following two write conditions: changing from '0' to '1', and changing from '1' to '0'. It is formed of first selection circuit 201, second selection circuit 202, first logic circuit (LOG1) 203, second logic circuit (LOG2) 204, first internal buffer circuit (BUF1) 205, and second internal buffer circuit (BUF2) 206. First selection circuit 201, first logic circuit 203, and first internal buffer circuit 205 constitute one circuit unit. Second selection circuit 202, second logic circuit 204, and second internal buffer circuit 206 constitute another one circuit unit.

First selection circuit 201 receives write data DIN and output data from first internal buffer circuit 205 as input data. When mode control signal MODE is '0', first selection circuit 201 selects write data DIN and outputs it. When mode control signal MODE is '1', first selection circuit 201 selects the output data from first internal buffer circuit 205 and outputs it.

The logic circuits determine rewrite-bit information according to read-out data and output from the selection circuits. To be specific, first logic circuit 203 receives output DIN1 from first selection circuit 201 and read-out data RO as input data. According to the value of mode control signal MODE, first logic circuit 203 works in a way below, and outputs first rewrite-bit information DO1 that indicates a bit to be rewritten from '0' to '1'.

FIG. 2 shows a truth table of first logic circuit 203 used for rewriting the state from '0' to '1'. In the read-back mode where mode control signal MODE is '0', first logic circuit 203 outputs rewrite-bit information DO1 of '0' for only a bit in which read-out data RO is '0' and write data DIN is '1'. In the verify mode where mode control signal MODE is '1', first logic circuit 203 outputs rewrite-bit information DO1 of '0' for only a bit in which read-out data RO is '0' and rewrite-bit information DIN1 that has been used in the previous rewrite and retained in first internal buffer circuit 205 is '0'.

Second selection circuit 202 receives write data DIN and output data from second internal buffer circuit 206 as input data. When mode control signal MODE is '0', second selection circuit 202 selects write data DIN and outputs it. When mode control signal MODE is '1', second selection circuit 202 selects the output data from second internal buffer circuit 206 and outputs it.

Second logic circuit 204 receives output DIN2 from second selection circuit 202 and read-out data RO as input data. According to the value of mode control signal MODE, second logic circuit 204 works in a way below, and outputs second rewrite-bit information DO2 that indicates a bit to be rewritten from '1' to '0'.

FIG. 3 shows a truth table of second logic circuit 204 used for rewriting the state from '1' to '0'. In the read-back mode where mode control signal MODE is '0', second logic circuit 204 outputs rewrite-bit information DO2 of '0' for only a bit in which read-out data RO is '1' and write data DIN is '0'. In the verify mode where mode control signal MODE is '1', second logic circuit 204 outputs rewrite-bit information DO2 of '0' for only a bit in which read-out data RO is '1' and rewrite-bit-information DIN2 that has been used in the previous rewrite and retained in second internal buffer circuit 206 is '0'.

Having a structure capable of storing rewrite-bit information for at least one address, first internal buffer circuit 205 receives output DO1 from first logic circuit 203 as input data. When first write-enable signal BUF1_LEN is asserted, first internal buffer circuit 205 obtains output DO1 from first logic circuit 203. Having a structure capable of storing rewrite-bit information for at least one address, second internal buffer circuit 206 receives output DO2 from second logic circuit 204 as input data. When second write-enable signal BUF2_EN is asserted, second internal buffer circuit 206 obtains output DO2 from second logic circuit 204.

Figure 4:
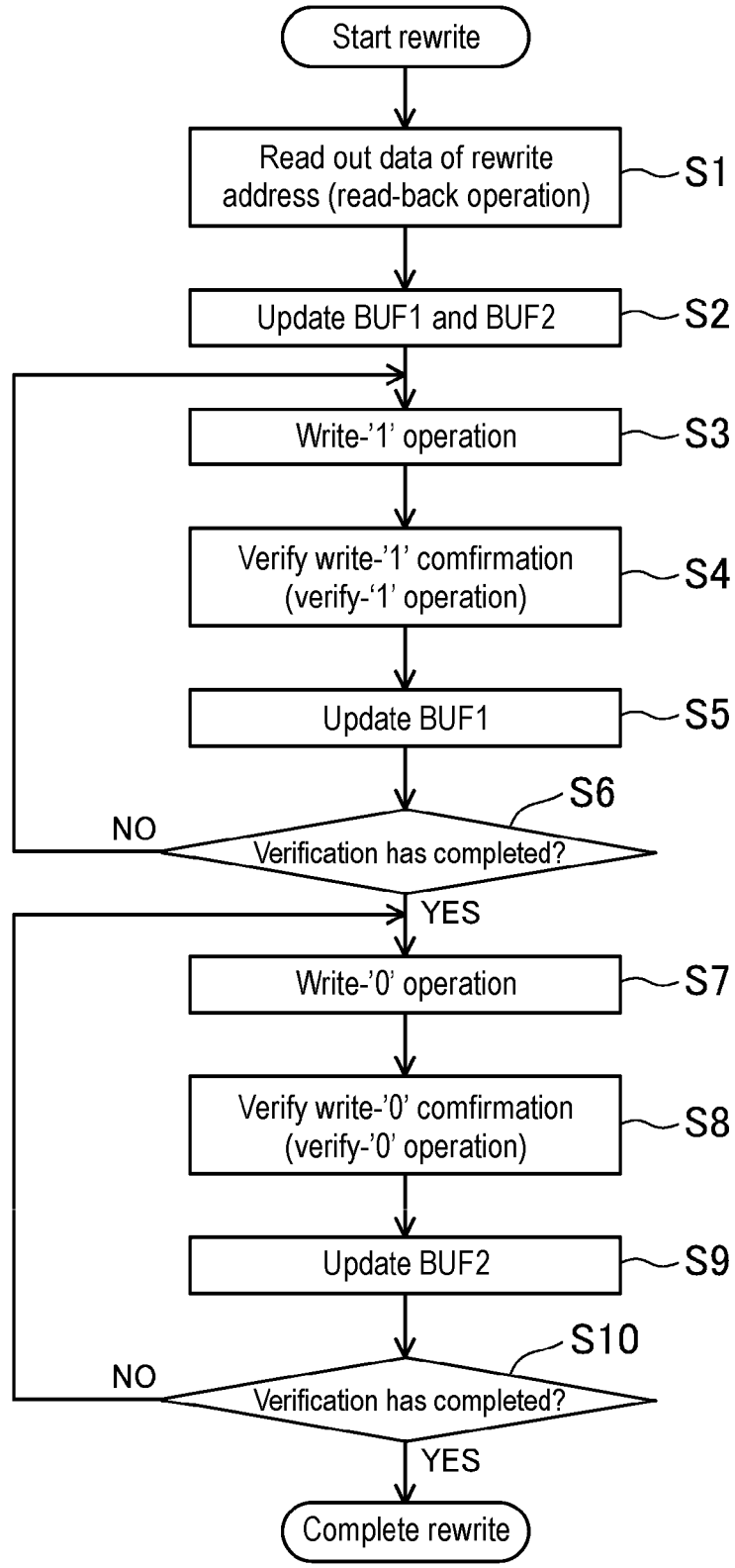
FIG. 4 is a flowchart showing rewrite operation of the nonvolatile semiconductor storage device of FIG. 1.

FIG. 4 is a flowchart showing rewrite operation of the nonvolatile semiconductor storage device of FIG. 1. Upon the start of rewriting, row decode circuit 101X and column decode circuit 101Y decode a write address to select a memory cell to be rewritten. Sense amplifier 102 reads out data in the memory cell assigned by the write address, i.e., read-back operation is performed (step S1). At that time, both of first selection circuit 201 and second selection circuit 202 output write data DIN.

Based on write data DIN, read-out data RO of the truth table of FIG. 2, first logic circuit 203 outputs rewrite-bit information; as for a bit to be rewritten from '0' to '1', it outputs rewrite-bit information of '0', while as for a bit with no need of rewriting from '0' to '1', it outputs rewrite-bit information of '1'. Similarly, based on write data DIN, read-out data RO of the truth table of FIG. 3, second logic circuit 204 outputs rewrite-bit information; as for a bit to be rewritten from '1' to '0', it outputs rewrite-bit information of '0', while as for a bit with no need of rewriting from '1' to '0', it outputs rewrite-bit information of '1'. At that time, first write-enable signal BUF1_EN is asserted, and output DO1 of first logic circuit 203 is buffered in first internal buffer circuit 205. Similarly, second write-enable signal BUF2_EN is asserted, and output DO2 of second logic circuit 204 is buffered in second internal buffer circuit 206 (step S2).

Data determination in first logic circuit 203 and second logic circuit 204 can be simultaneously performed. Data storage in first internal buffer circuit 205 and second internal buffer circuit 206 can be simultaneously performed. That is, generation of rewrite-bit information that indicates rewriting from '0' to '1' and rewriting from '1' to '0' can be simultaneously performed. Data storage can be simultaneously performed.

As a result of generating rewrite-bit-information, when the rewrite-bit information that indicates rewriting from '0' to '1' is '0', an electrical data rewrite from '0' to '1' (hereinafter, write-'1' operation) is performed on a target memory cell by data rewrite circuit 103 (step S3). As an exemplary embodiment of the present disclosure, it is preferable that the rewrite-bit information, which indicates that a data rewrite is needed or not for each change pattern of the write conditions of the plurality of memory cells according to read-out data and prepared write data, should be concurrently generated. The "concurrent generation" means that each generation time of rewrite-bit information that indicates rewriting from '0' to '1' and rewriting from '1' to '0' of the cell are overlapped with each other.

After write-'1' operation is performed, in step S4, a memory cell is verified whether it is rewritten as intended or not (hereinafter, this is referred to verify-'1' operation). At that time, mode control signal MODE is set to '1'; accordingly, first selection circuit 201 selects the output data from first internal buffer circuit 205.

Based on the rewrite-bit information previously fed from first internal buffer circuit 205 and read-out data RO of the truth table of FIG. 2, first logic circuit 203 outputs rewrite-bit information of '0' for a bit that needs data-rewrite operation again from '0' to '1'. First write-enable signal BUF1_LEN is asserted, and output DO1 of first logic circuit 203 is buffered in first internal buffer circuit 205 (step S5). At that time, second write-enable signal BUF2_EN is in the negate state; the data in second internal buffer circuit 206 is kept as it is with no update.

After verify-'1' operation, if a bit that needs data-rewrite operation again from '0' to '1' is found, the procedure goes back to step S3 to perform write-'1' operation again, based on the rewrite-bit information from '0' to '1'. The write-'1' operation and the verify-'1' operation are repeatedly performed until there is no bit that needs data-rewrite operation from '0' to '1'. That is, when all bits of the rewrite-bit information stored in first internal buffer circuit 205 are '1', the write-'1' operation is completed (step S6).

After completion of the write-'1' operation, according to the rewrite-bit information from '1' to '0', an electrical data rewrite from '1' to '0' (hereinafter, write-'0' operation) is performed on a target memory cell by data rewrite circuit 103 (step S7).

After write-'0' operation is performed, in step S8, a memory cell is verified whether it is rewritten as intended or not (hereinafter, this is referred to verify-'0' operation). At that time, mode control signal MODE is set to '1'; accordingly, second selection circuit 202 selects the output data from second internal buffer circuit 206.

Based on the rewrite-bit information previously fed from second internal buffer circuit 206 and read-out data RO of the truth table of FIG. 3, second logic circuit 204 outputs rewrite-bit information of '0' for a bit that needs data-rewrite operation again from '1' to '0'. Second write-enable signal BUF2_EN is asserted, and the output of second logic circuit 204 is buffered in second internal buffer circuit 206 (step S9). At that time, first write-enable signal BUF1_LEN is in the negate state; the data in first internal buffer circuit 205 is kept as it is with no update.

After verify-'0' operation, if a bit that needs data-rewrite operation again from '1' to '0' is found, the procedure goes back to step S7 to perform write-'0' operation again, based on the rewrite-bit information from '1' to '0'. The write-'0' operation and the verify-'0' operation are repeatedly performed until there is no bit that needs data-rewrite operation again from '1' to '0'. That is, when all bits of the rewrite-bit information stored in second internal buffer circuit 206 are '1', the write-'0' operation is completed (step S10).

As the procedures described above, on completion of the write-'1' operation and the write-'0' operation, the rewrite operation of the nonvolatile semiconductor storage device is completed. In the flowchart of the description, the write-'1' operation is performed ahead of the write-'0' operation, however, the write-'0' operation may be performed ahead of the write-'1' operation.

Second Exemplary Embodiment

Figure 5:
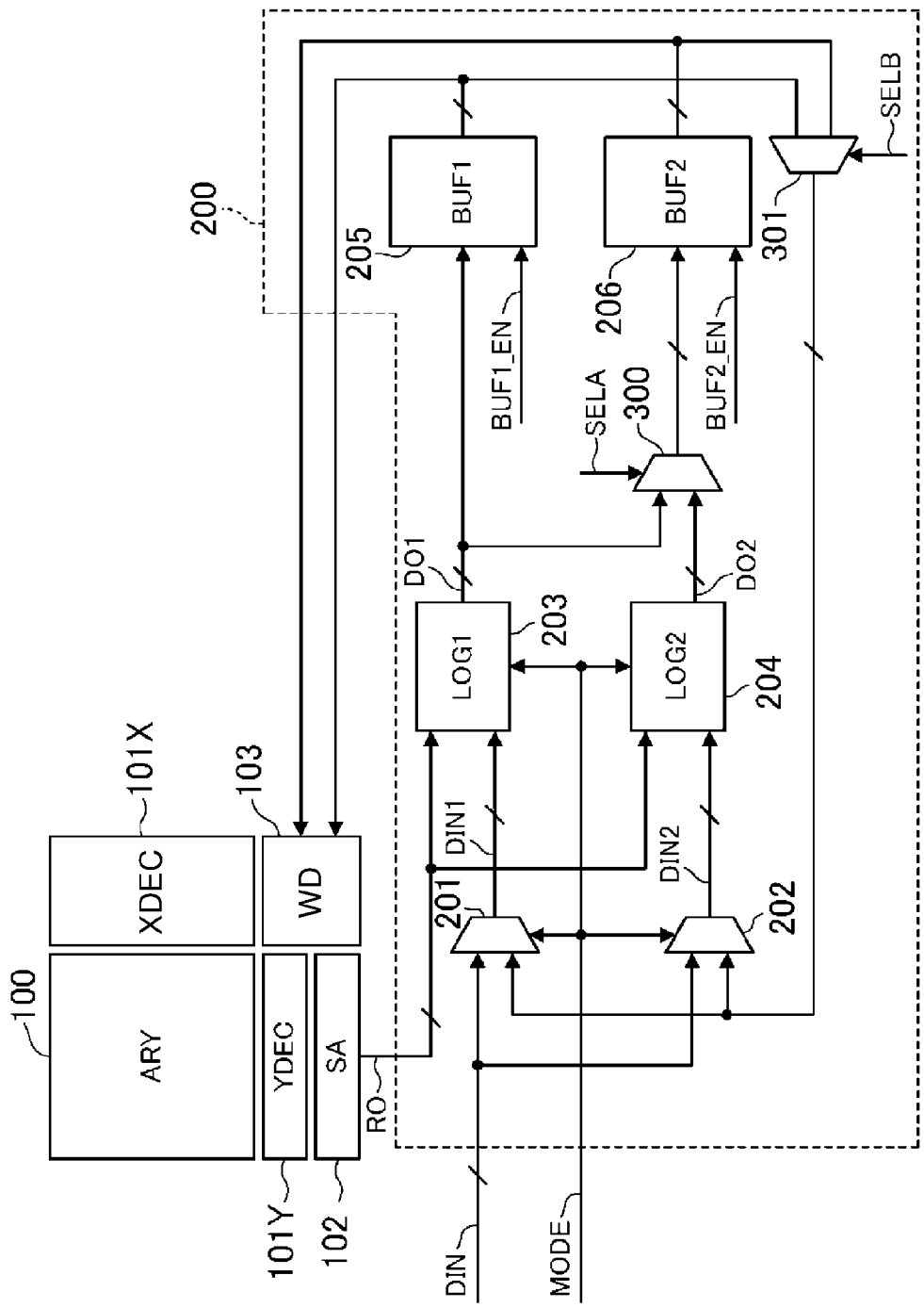
FIG. 5 is a block diagram of a nonvolatile semiconductor storage device of a second exemplary embodiment of present disclosure.

FIG. 5 is a block diagram of a nonvolatile semiconductor storage device of the second exemplary embodiment of the present disclosure. In addition to the structure in FIG. 1, rewrite-bit-information generating circuit 200 in FIG. 5 further has logic output selection circuit 300 and internal buffer selection circuit 301.

According to first selection control signal SELA, logic output selection circuit 300 selects any one of output DO1 from first logic circuit 203 and output DO2 from second logic circuit 204, and the selected output is connected to input of second internal buffer circuit 206. According to second selection control signal SELB, internal buffer selection circuit 301 selects any one of the output of first internal buffer circuit 205 and the output of second internal buffer circuit 206, and the selected output is connected to one of the inputs of first section circuit 201 and one of the inputs of second selection circuit 202.

According to the second exemplary embodiment, in the normal data rewrite, logic output selection circuit 300 and internal buffer selection circuit 301 are connected so as to work similar to the structure of the first exemplary embodiment. The structure of the embodiment contributes to high-speed generation of rewrite-bit information from '0' to '1' and from '1' to '0'. The circuit operations in the normal data rewrite other than the aforementioned high-speed generation have already been described in the first exemplary embodiment, and therefore description thereof will be omitted.

According to the rewrite procedure of the second exemplary embodiment, for example, when a memory region to be rewritten has a uniform write condition or write data DIN has uniformity, any one of the data rewrite from '0' to '1' and the data rewrite from '1' to '0' may be not performed. The description below is on an operation example in which the data rewrite only from '0' to '1' is performed in the structure of the second embodiment shown in FIG. 5.

Upon the start of rewriting, sense amplifier 102 reads out data of a memory cell assigned by the write address. At that time, first selection circuit 201 outputs write data DIN.

Based on write data DIN, read-out data RO of the truth table of FIG. 2, first logic circuit 203 outputs rewrite-bit information; as for a bit to be rewritten from '0' to '1', it outputs rewrite-bit information of '0', while as for a bit with no need of rewriting from '0' to '1', it outputs rewrite-bit information of '1'. At that time, first write-enable signal BUF1_EN is asserted, and output DO1 of first logic circuit 203 is buffered in first internal buffer circuit 205.

Next, sense amplifier 102 reads out data of a memory cell assigned by another address that is different from the previous write address. At that time, second selection circuit 202 outputs write data DIN.

Based on write data DIN, read-out data RO of the truth table of FIG. 2, first logic circuit 203 outputs rewrite-bit information; as for a bit to be rewritten from '0' to '1', it outputs rewrite-bit information of '0', while as for a bit with no need of rewriting from '0' to '1', it outputs rewrite-bit information of '1'. Logic output selection circuit 300 selects output DO1 of first logic circuit 203 and connects it to second internal buffer circuit 206. Second write-enable signal BUF2_EN is asserted, and output DO1 of first logic circuit 203 is buffered in second internal buffer circuit 206.

Employing logic output selection circuit 300 allows output DO1 of first logic circuit 203 to be stored in first internal buffer circuit 205 and second internal buffer circuit 206. This increases the size of write buffer, contributing to high-speed rewrite operation.

As a result of generating rewrite-bit information, when the rewrite-bit information that indicates rewriting from '0' to '1' is '0', data rewrite circuit 103 performs write-'1' operation. Specifically, data rewrite circuit 103 performs write-'1' operation with use of rewrite-bit information stored in first internal buffer circuit 205, and subsequently, it performs write-'1' operation with use of rewrite-bit information stored in second internal buffer circuit 206.

After the write-'1' operation, verify-'1' operation is performed to verify whether a memory cell is rewritten as intended or not. First internal buffer selection circuit 301 selects the output of first internal buffer circuit 205 and outputs it. At that time, first selection circuit 201 selects the output of internal buffer selection circuit 301.

Based on the rewrite-bit information previously fed from first internal buffer circuit 205 and read-out data RO of the truth table of FIG. 2, first logic circuit 203 outputs rewrite-bit information of '0' for a bit that needs data-rewrite operation again from '0' to '1'. First write-enable signal BUF1_LEN is asserted, and output DO1 of first logic circuit 203 is buffered in first internal buffer circuit 205. At that time, second write-enable signal BUF2_EN is in the negate state; the data in second internal buffer circuit 206 is kept as it is with no update.

After completion of verify-'1' operation for first internal buffer circuit 205, verify-'1' operation for second internal buffer circuit 206 is performed. Prior to the operation, internal buffer selection circuit 301 selects the output of second internal buffer circuit 206 and outputs it. At that time, first selection circuit 201 selects the output of internal buffer selection circuit 301.

Based on the rewrite-bit-information previously fed from first internal buffer circuit 205 and read-out data RO of the truth table of FIG. 2, first logic circuit 203 outputs rewrite-bit information of '0' for a bit that needs data-rewrite operation from '0' to '1'. Logic output selection circuit 300 selects output DO1 of first logic circuit 203 and connects it to second internal buffer circuit 206. Second write-enable signal BUF2_EN is asserted, and output DO1 of first logic circuit 203 is buffered in second internal buffer circuit 206. At that time, first write-enable signal BUF1_LEN is in the negate state; the data in first internal buffer circuit 205 is kept as it is with no update.

The write-'1' operation and the verify-'1' operation are repeatedly performed until there is no bit that needs data-rewrite operation from '0' to '1'. On completion of the write-'1' operation, data rewrite operation of the nonvolatile semiconductor storage device is completed.

To perform a data rewrite only from '1' to '0', logic output selection circuit 300 is disposed on the input side of first internal buffer circuit 205, not on the input side of second internal buffer circuit 206.

According to the second exemplary embodiment, as described above, when a data rewrite is performed in one way, for example, when the write condition or the data expected values after write operation has uniformity, a source in rewrite-bit-information generating circuit 200 is effectively used, by which high-speed rewrite operation is attained.

The data rewrite in the first and the second exemplary embodiments is described as an example using binary memory, but it is merely for simplifying the description. It is also applicable to a data rewrite using multivalued memory.

Further, in the description above, mode control signal MODE is commonly fed to first selection circuit 201, second selection circuit 202, first logic circuit 203, and second logic circuit 204, but it is not limited thereto.

Further, as for a logic circuit that outputs rewrite-bit information indicating a certain change in write condition and a selection circuit, the following structure and connection may be employed. That is, two logic circuits are disposed, one is for the read-back mode and the other is for the verify mode. The logic circuit for the read-back mode receives write data DIN and read-out data RO as input, whereas the logic circuit for the verify mode receives output of the internal buffer circuit and read-out data RO, and the outputs from the two logic circuits are selected by the selection circuit. In that case, the output of the selection circuit is connected to input of internal buffer circuits 205, 206 or to input of logic output selection circuit 300.

INDUSTRIAL APPLICABILITY

As described above, the present disclosure not only enhances endurance characteristics and data retention characteristics of memory cells but also achieves a high-speed data rewrite in a nonvolatile semiconductor storage device capable of a bitwise bidirectional data rewrite. For example, it is useful for the nonvolatile semiconductor storage device such as ReRAM and MRAM.

REFERENCE MARKS IN THE DRAWINGS 100 nonvolatile memory array
101X row decode circuit
101Y column decode circuit
102 sense amplifier (read-out circuit)
103 data rewrite circuit
200 rewrite-bit-information generating circuit 201, 202 selection circuit
203, 204 logic circuit
205, 206 internal buffer circuit
300 logic output selection circuit
301 internal buffer selection circuit

The invention claimed is:

1. A method for rewriting a nonvolatile semiconductor storage device with a plurality of memory cells each of which having a plurality of write conditions, the method comprising:
   acquiring read-out data from at least any one memory cell selected from the nonvolatile memory array;
   generating concurrently rewrite-bit information indicating that a data rewrite is needed or not for a change pattern of each write condition of the plurality of memory cells based on, in a read-back mode, the read-out data and a prepared write data and, in a verify mode, the read-out data and the rewrite-bit information generated previously;
   repeating a data rewrite on a first change pattern for memory cells for the first change pattern indicated by the generated rewrite-bit information until completion of the data rewrite of all the memory cells on the first change pattern is confirmed; and
   after the completion of the data rewrite of the selected memory cell on the first change pattern, repeating a data rewrite on a second change pattern for memory cells for the second change pattern indicated by the generated rewrite-bit information until completion of the data rewrite of all the memory cells on the second change pattern is confirmed.

2. The method of claim 1, further comprising retaining the generated rewrite-bit information in internal buffer circuits.

3. A nonvolatile semiconductor storage device comprising:
   a nonvolatile memory array with a plurality of memory cells each of which having a plurality of write conditions;
   a decode circuit that selects at least any one of the memory cells of the nonvolatile memory array;
   a read-out circuit that obtains read-out data from the selected memory cell;
   a rewrite-bit-information generating circuit that generates rewrite-bit information indicating that a data rewrite is needed or not, based on the read-out data and a prepared write data; and
   a data rewrite circuit that rewrites the data of the selected memory cell, based on the generated rewrite-bit information, wherein:
   the rewrite-bit-information generating circuit has units, each of which is formed of an internal buffer circuit, a selection circuit, and a logic circuit, for each of change patterns of the write conditions of the plurality of memory cells,
   the internal buffer circuit retains the generated rewrite-bit information,
   the selection circuit selects and outputs any one of the write data and the rewrite-bit information stored in the internal buffer circuit,
   the logic circuit determines the rewrite-bit information based on the read-out data and the output of the selection circuit, in a read-back mode where the selection circuit selects and outputs the write data, when a combination of the read-out data and the write data agrees with the change pattern of the write condition assigned to the logic circuit, the logic circuit determines the rewrite-bit information so as to indicate necessity of a data rewrite, and
   when a combination of the read-out data and the write data does not agree with the change pattern of the write condition assigned to the logic circuit, the logic circuit determines the rewrite-bit information so as to indicate necessity of a data rewrite,
   in a verify mode where the selection circuit selects and outputs the rewrite-bit information stored in the internal buffer circuit,
   when the rewrite-bit information stored in the internal buffer circuits indicates that a data rewrite has been performed just before and when the read-out data read again from the selected memory cell does not agree with a post-change expected-value data of the change pattern of the write condition assigned to the logic circuit, the logic circuit determines the rewrite-bit information so as to indicate necessity of once-again data rewrite, and
   when the rewrite-bit information stored in the internal buffer circuit indicates that no data rewrite has been performed just before and/or when the read-out data read again from the selected memory cell agrees with the post-change expected-value data of the change pattern of the write condition assigned to the logic circuit, the logic circuit determines the rewrite-bit information so as to indicate necessity of once-again data rewrite.

4. The nonvolatile semiconductor storage device according to claim 3, wherein the rewrite-bit-information generating circuit further contains a logic output selection circuit that selects any one of outputs from the plurality of logic circuits and transmits the selected output to a specific one of the plurality of internal buffer circuits.

5. The nonvolatile semiconductor storage device according to claim 4, wherein the rewrite-bit-information generating circuit further contains an internal buffer selection circuit that selects any one of outputs from the plurality of internal buffer circuits and transmits the selected output to each one of the plurality of selection circuits.

* * * * *